United States Patent
Arnold et al.

(10) Patent No.: US 10,992,272 B2
(45) Date of Patent: Apr. 27, 2021

(54) HIGH-FREQUENCY MODULE WITH CONNECTION INTERFACE

(71) Applicant: Tesat-Spacecom GmbH & Co. KG, Backnang (DE)

(72) Inventors: Christian Arnold, Backnang (DE); Tobias Janocha, Backnang (DE); Ulrich Mahr, Backnang (DE); Benjamin Falk, Backnang (DE)

(73) Assignee: Tesat-Spacecom GmbH & Co. KG, Backnang (DE)

( * ) Notice: Subject to any disclaimer, the term of this patent is extended or adjusted under 35 U.S.C. 154(b) by 5 days.

(21) Appl. No.: 16/555,691

(22) Filed: Aug. 29, 2019

(65) Prior Publication Data
US 2020/0162045 A1    May 21, 2020

(30) Foreign Application Priority Data
Nov. 15, 2018  (DE) .......................... 102018128659.7

(51) Int. Cl.
| | | |
|---|---|---|
| H03F 3/187 | (2006.01) | |
| H03F 3/58 | (2006.01) | |
| H03F 3/189 | (2006.01) | |
| H04B 7/185 | (2006.01) | |
| H01J 25/34 | (2006.01) | |
| H03F 3/21 | (2006.01) | |

(52) U.S. Cl.
CPC ................ *H03F 3/58* (2013.01); *H01J 25/34* (2013.01); *H03F 3/189* (2013.01); *H03F 3/21* (2013.01); *H04B 7/18515* (2013.01)

(58) Field of Classification Search
CPC ....................................................... H03F 3/187
USPC .................................................. 330/307, 310
See application file for complete search history.

(56) References Cited

U.S. PATENT DOCUMENTS

| | | | |
|---|---|---|---|
| 5,500,621 A | 3/1996 | Katz et al. | |
| 9,252,729 B2 * | 2/2016 | Lesso .................... | H03F 1/0261 |
| 9,530,604 B2 | 12/2016 | Katz et al. | |
| 10,194,772 B2 * | 2/2019 | Purgatorio .......... | A47J 36/2466 |
| 2010/0039347 A1 | 2/2010 | Chen et al. | |
| 2015/0256211 A1 | 9/2015 | Miyazaki | |
| 2016/0344439 A1 | 11/2016 | Seol et al. | |
| 2017/0020012 A1 | 1/2017 | Park et al. | |

(Continued)

FOREIGN PATENT DOCUMENTS

| | | |
|---|---|---|
| DE | 102012109565 A1 | 4/2013 |
| EP | 2099054 A2 | 9/2009 |
| EP | 2445103 A1 | 4/2012 |

(Continued)

*Primary Examiner* — Henry Choe
(74) *Attorney, Agent, or Firm* — Jenkins, Wilson, Taylor & Hunt, P.A.

(57) ABSTRACT

A high-frequency module can be used in communication satellites. The high-frequency module contains an electronic unit and a housing. The housing at least partially encloses the electronic unit, and the electronic unit is arranged at least partially in an interior space of the housing. An internal connector is arranged on the housing, which is coupled to the electronic unit such that electrical signals can be transmitted between the electronic unit and the internal connector. The internal connector is constructed integrally with at least a part of the housing. This allows a thermo-mechanical stress on the electronic unit to be reduced.

14 Claims, 4 Drawing Sheets

(56) References Cited

U.S. PATENT DOCUMENTS

2017/0111077 A1    4/2017  Hwang et al.

FOREIGN PATENT DOCUMENTS

| EP | 2775612 A1 | 9/2014 |
| GB | 2520228 A | 5/2015 |
| WO | 2006065388 A1 | 6/2006 |

* cited by examiner

HIGH-FREQUENCY MODULE WITH CONNECTION INTERFACE

CROSS-REFERENCE TO PRIORITY APPLICATION

This application claims the benefit of, and priority to, German patent application number DE 102018128659.7, filed Nov. 15, 2018. The content of the referenced application is incorporated by reference herein.

TECHNICAL FIELD

Embodiments of the subject matter described herein relate generally to high-frequency technology. In particular, the disclosure relates to a high-frequency module with a connection interface. The disclosure further relates to a satellite having such a high-frequency module, wherein the high-frequency module can be used, for example, as part of a communication device or a data transmission link, in particular a satellite transmission link or a satellite radio transmission link.

BACKGROUND

Systems in the field of high-frequency technology are used to transmit signals and data from a transmission system to a receiving system. High-frequency technology is preferably used when data needs to be transferred over a large distance (up to several hundred or several thousand kilometers).

Before signals are transferred to the air interface (e.g. antenna), they can require, for example, processing or conditioning. High-frequency technology is used on communications satellites, for example, in order to amplify, combine and filter communication signals. A high-frequency system often includes individual modules (low-noise amplifiers, known as LNA, filters, couplers, insulators, pre-amplifiers, power amplifiers, etc.) that are connected to each other.

Interfaces are provided between these modules in order to create a mechanical and electrical coupling between the modules. These interfaces are designed to fulfil different functions, for example to minimize the electrical losses and/or to configure the mechanical strength of the interface in accordance with specifications.

EP 2 775 612 A1 and U.S. Pat. No. 9,530,604 B2 describe a signal transmission unit, which is used in the high-frequency range and, in particular, is used in a communications satellite.

BRIEF SUMMARY

The object of the disclosure can be considered to be designing a connection interface for a high-frequency module so as to simplify an assembly process of the high-frequency module. The connection interface can be a high-frequency interface, for example an output interface or input interface.

This object is achieved by the subject matter of the independent claim. Advantageous embodiments are obtained from the dependent claims and the following description.

In accordance with one aspect, a high-frequency module with an electronic unit and a housing is specified. The housing at least partially encloses the electronic unit and the electronic unit is arranged at least partially in an internal space of the housing. The housing has an internal connector, which is coupled to the electronic unit such that electrical signals can be transmitted between the electronic unit and the internal connector. The internal connector is designed integrally with at least a part of the housing, such as a base wall or side wall.

In particular, a signal output or a signal input of the electronic unit is connected to the internal connector. For example, a signal output of the electronic unit provides a useful signal, which is output from the electronic unit as the result of at least one processing step and transmitted to subsequent units (for example, an antenna). If the connector of the electronic unit is used as a signal input, said connector receives a signal.

The electronic unit can be a signal source or a signal sink. For example, the electronic unit can have a plurality of interfaces, one interface of the electronic unit being coupled to one internal connector of the housing in each case. To this end, the housing can comprise a plurality of internal connectors. In addition, one interface of the electronic unit can then be configured as a receiving interface and another interface as a transmitting interface so that the electronic unit transmits and/or receives via different interfaces at the same time. In this case, therefore, there are separate transmit/receive channels. But it is also conceivable that an interface of the electronic unit is operated in time-duplex mode sequentially as either a transmitting interface or a receiving interface.

The whole housing does not need to be integrally constructed, but the internal connector, to which the electronic unit is routed for signal transmission, is a part of the housing, i.e. the internal connector is designed integrally with this part of the housing. For example, the internal connector can be a part of a housing base or a housing cover.

The structure described here has the advantage that it greatly simplifies an assembly procedure of the high-frequency module. The signal from the electronic unit does not need, for example, to be passed through the housing wall to the outside or inside by means of a coaxial cable. Instead, the useful signal is routed from the output of the electronic unit directly to the internal connector as part of the housing and forwarded via the housing or vice versa.

The high-frequency module enables a mechanical decoupling of the electronic unit and of the connection which is connected to the electronic unit from the elements located outside of the housing.

The internal connector can contain a signal propagation path which is milled into the housing, in particular into the housing wall. Via this internal connector the useful signal is then routed to the outside. The signal propagation path can also contain or consist of so-called corrugations. The corrugations are properties introduced into the material of the housing, which are designed, for example, to adapt the signal to be transmitted.

In the context of this description, the term high-frequency refers to a frequency range above one GHz (Gigahertz, 1×10E9 Hertz). Such frequency ranges are used, for example, in satellite radio transmission links. Such a satellite radio transmission link can be, for example, a Ka-band transmission link in a frequency range of 17.7-21.2 GHz for the downlink and 27.5-31 GHz for the uplink, a Ku- or X-band implementation in the range around 11 or 7 GHz, or an L-band (around 1.5 GHz), S-band (around 2.5 GHz), or C-band implementation (around 4 GHz).

It should be noted that all comments in this description apply to both the operation of the electronic unit as a signal source and as a signal sink, unless explicitly indicated otherwise. The general reference in the description to a signal output also applies to a signal input.

In accordance with one embodiment, the internal connector is formed by an internal surface of the housing.

The electronic module is technically routed for signal transmission to the internal surface of the housing. A separate connector element, isolated from the housing, is therefore unnecessary.

According to a further embodiment, the internal connector is formed by a tab of the housing that protrudes into the internal space.

The internal connector thus forms a web or pin which protrudes into the interior starting from the internal surface of the housing. The electronic module is connected to this web or pin.

According to a further embodiment, an electrically non-conductive material is at least partially arranged in a gap between the tab and adjacent housing wall sections.

This material can be, for example, a dielectric material, such as Teflon. This reduces or even suppresses interference effects at high frequencies.

According to a further embodiment, the housing comprises aluminum or an aluminum alloy.

Generally speaking, the housing is made of an electrically conductive material. This can be aluminum or an aluminum alloy, for example an aluminum-silicon alloy. Other materials are possible. The housing can be manufactured completely from the same material. In particular, the housing can have a base and a cover. The interior of the housing is located in the base or is formed by the base. The cover and base can be made from the same material. At the end of an assembly process of the high-frequency module the cover is attached to the base and at least partially covers or closes the interior.

For use in outer space or in earth orbit, materials which are suitable for this usage due to their thermal expansion coefficient are preferred. The temperature fluctuations outside the Earth's atmosphere can be very large, due in particular to the fact that the atmosphere required for the removal of heat is lacking. The change between the presence and absence of solar irradiation can then cause very large temperature fluctuations in satellites and their components.

In order to minimize mechanical stresses at the interfaces between different components, in particular components made of different materials, the materials can be selected so that the thermal expansion coefficients are matched to each other, i.e. almost equal or within a specific range of values.

According to a further embodiment, the electronic unit is a high-power amplifier, in particular a high-power transistor amplifier.

In a further alternative embodiment, the electronic unit is a low noise amplifier (LNA), or a receiver (LNA with frequency converter).

Other designs are also possible. The designs for highly integrated high-frequency modules can be arranged in the input area or in the output area.

A high-power amplifier is used, for example, in communication satellites in order to amplify communication signals and forward them over a transmission path, for example, to an emission unit or antenna unit.

A high-power transistor amplifier can also be referred to as a solid-state power amplifier (SSPA). This type of amplifier is used at high frequencies as an alternative or in addition to so-called travelling wave tube amplifiers. SSPAs are available in different power classes and for very high frequency bands. For example, SSPAs can be used in the following frequency bands: C, X, Ku, Ka and Q-Band. At these frequencies and in these power classes waveguides are preferred on the output side of the amplifier, if not actually necessary. The electronic unit can thus be a SSPA for the above frequency bands.

According to a further embodiment a connection between the electronic unit and the internal connector is a microstrip connection.

A so-called microstrip line is an electrical waveguide having one or more electrically conductive strips. The strips can be mounted on a dielectric.

The microstrip connection is connected at one end to the electronic unit. In the case of a high-power transistor amplifier, one end of the microstrip connection is placed directly on the semiconductor substrate and coupled thereto so that no other separate microstrip line is necessary to create the connection from the semiconductor substrate to the waveguide junction.

The connection can be produced using so-called wire bonding. In this case, the connectors of the SSPA, i.e. an integrated circuit, are connected via the microstrip connection to the internal connector of the housing. For the bonding, ribbon cables or ribbon conductors can also be used, so-called ribbon bonding.

According to a further embodiment, the housing has a second internal connector which is implemented integrally with the housing, the second internal connector being connected to the electronic unit.

The second internal connector is preferably spaced apart from the first internal connector (the above-mentioned internal connector). A second output of the electronic unit can be connected to the second internal connector, wherein the same options exist for this purpose as those mentioned above in connection with the first internal connector.

In one exemplary embodiment, a second electronic unit can be arranged in the interior of the housing and the second electronic unit is connected to the second internal connector to output a useful signal.

The first internal connector and the second internal connector each form a signal propagation path, or channel. Each channel can have at least one semiconductor substrate or a semiconductor, for example, a transistor. The respective transistor of a signal propagation path is placed on an electrically non-conductive substrate tile, which provides a galvanic isolation for direct currents. In order to provide an isolation between the signal propagation paths in the high-frequency range, a suitable distance between the signal propagation paths and their elements is selected so that the signal propagation paths do not affect or interfere with each other. In order to achieve this, further elements can also be incorporated in the housing material, such as metallic elements, seals, or RF absorber material.

According to a further embodiment, a surface of the housing is at least partially coated with gold or silver.

This can have a positive effect on the electrical conductivity. At least a portion of the surface, inside and/or outside, of the housing is similarly coated. The coating can be a few microns thick.

In a further embodiment, the high-frequency module additionally comprises a first waveguide section. The first waveguide section rests against an outer surface of the housing.

Thus, the useful signal is routed from the electronic unit in the housing via the connection to the internal connector of the housing and from the housing onto the waveguide.

This structure makes it possible to design the high-frequency module in a modular fashion. Firstly, the housing with the internal electronic unit and the connection between the housing and the electronic unit can be produced and/or assembled. Up to this point the waveguide is not coupled or connected to the housing. Only when the electronic unit in the interior of the housing is connected to the internal connector is the housing coupled to the waveguide. The housing is connected to the waveguide as a fully assembled module.

According to a further embodiment, the first waveguide section includes a first half-shell and a second half-shell, the housing being arranged between the first half-shell and the second half-shell.

The housing is thus surrounded by the waveguide and the signal from the electronic unit is transmitted onto the waveguide via the housing. For this purpose, at least one external connector can be provided on the housing.

If the housing provides a plurality of channels, each channel can be provided with a separate external connector.

The signal connection between the housing and the waveguide is produced, for example, by the two half-shells being connected to each other and resting against the outer surface of the housing. The waveguide is therefore pressed onto the outer surface of the housing. It is also conceivable, however, that the waveguides are connected to the housing with a positive fit, for example, bolted thereto.

According to a further embodiment, the high-frequency module additionally comprises a second waveguide section, which is connected to the first waveguide section so that the housing is enclosed by the first waveguide section and the second waveguide section.

The housing with the electronic unit is therefore encapsulated in the waveguide having or consisting of the first and second waveguide sections. Thus, the electronic unit in the housing is thermo-mechanically decoupled from the waveguide and each of the individual waveguide sections.

The first waveguide section and the second waveguide section are mechanically connected to each other. For example, the two waveguide sections are bolted together. The waveguide sections are preferably reversibly connected to each other, so that the housing can also be removed from the waveguide. It is also conceivable, however, that the two waveguide sections are connected to each other with a material bond and hence non-reversibly.

The connection point of the first waveguide section to the second waveguide section can be produced by direct contact between the metallic walls of the housing. A gap can also exist between the metallic housing walls, via which capacitive coupling takes place. A soft, electrically conductive, elastically deformable or flexible material can also be introduced into the connection point of the first waveguide section to the second waveguide section, in order to ensure the galvanic contact.

According to a further embodiment, the second waveguide section contains at least one element from the group comprising the following elements: filters, insulators, bends, antennas, circulators, multiplexers.

In the second waveguide section, therefore, all the elements that are necessary or desirable for processing the high-frequency signals from the electronic unit can be arranged.

According to a further embodiment the housing is designed integrally with the first internal connector and the second internal connector, if present, as well as with all other components of the housing.

Alternatively, the housing can include or consist of two or more parts, for example from partial shells or half-shells.

According to a further aspect, a communications satellite is specified. The communications satellite has a high-frequency module as described above and in the following, the high-frequency module being arranged in a data transmission link in the communications satellite.

A communications satellite is a spacecraft intended for use in Earth's orbit, which contains a communication system for sending and receiving data and/or signals. In addition, a communications satellite can also contain units for processing the data. The high-frequency module can preferably be used in a signal processing path of the communication system of the communications satellite.

The high-frequency module is used for the conditioning, processing and amplification of signals, especially high-frequency signals in the above-mentioned frequency bands.

The structure of the high-frequency module described herein makes the module suitable in particular for use outside of or in the outermost strata of the Earth's atmosphere. The thermo-mechanical decoupling of the electronic unit (for example, an amplifier unit) from the waveguide reduces the mechanical stress on the electronic unit and on an outgoing connection from the electronic unit.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

In the following, exemplary embodiments will be discussed in detail based on the attached drawings. The illustrations are schematic and not drawn to scale. Identical reference numerals refer to identical or similar elements. Shown are.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Figure 1:
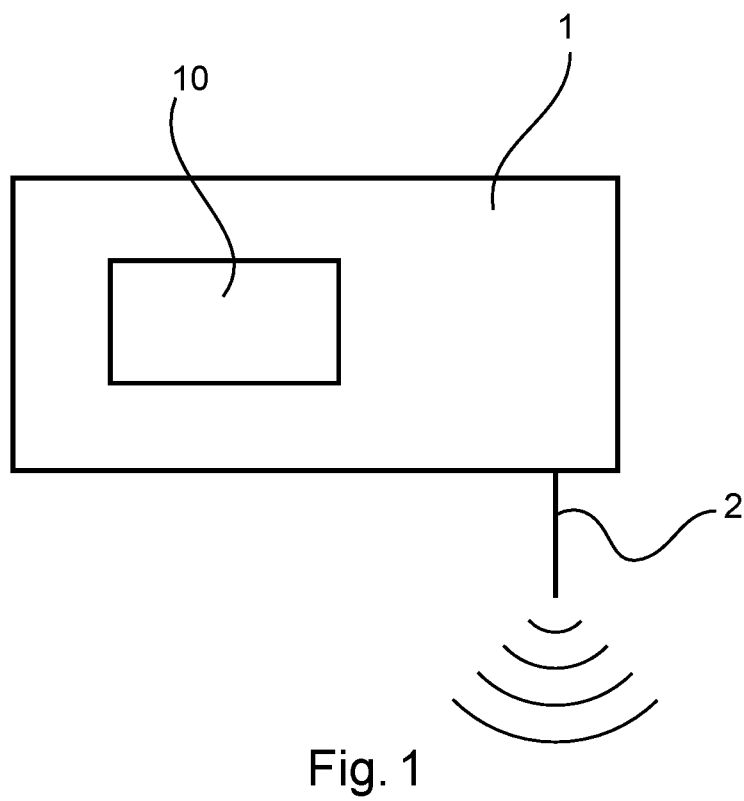
FIG. 1 a schematic drawing of a communications satellite in accordance with one exemplary embodiment.

FIG. 1 shows a schematic illustration of a communications satellite 1. A high-frequency module 10 is arranged in the communications satellite 1. The high-frequency module 10 may form part of a signal transmission path in the communications satellite. For example, the high-frequency module 10 can be part of a control unit or the signal processing for a transmission unit 2, the transmission unit 2 being, for example, an antenna.

The high-frequency module described herein is particularly suitable for the signal-transmission connection of transistor amplifiers or more generally, semiconductor amplifiers (SSPA), to a signal output.

Figure 2:
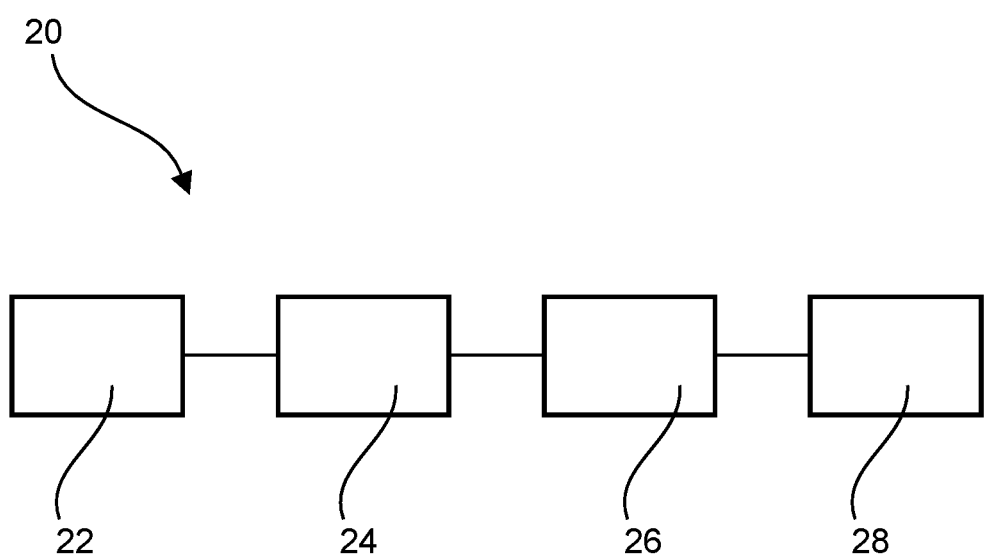
FIG. 2 a schematic drawing of a block circuit diagram of a high-power transistor amplifier.

FIG. 2 shows an example of a block circuit diagram of a semiconductor amplifier 20 (SSPA). It is particularly in high-performance applications where SSPAs have recently begun to replace or supplement travelling-wave tube amplifiers. In particular in applications where the SSPAs replace the travelling-wave tubes, high power requirements are placed on the amplifier components at very high frequencies. At high power levels and high frequencies (for example, C, X, Ku, Ka and Q-Band), waveguide outputs are the preferred technology.

A typical SSPA 20 has an input interface 22, a pre-amplifier 24, a high-power amplifier 26 and an output interface 28. To reduce losses in the output interface as far as possible, it is desirable to arrange a waveguide output as close as possible to the output stage of the high-power amplifier, thus the element 26.

At least the high-power amplifier 26, but also other modules shown in FIG. 2, can be arranged within the housing of the high-frequency module claimed herein and be referred to as an electronic unit.

Figure 3:
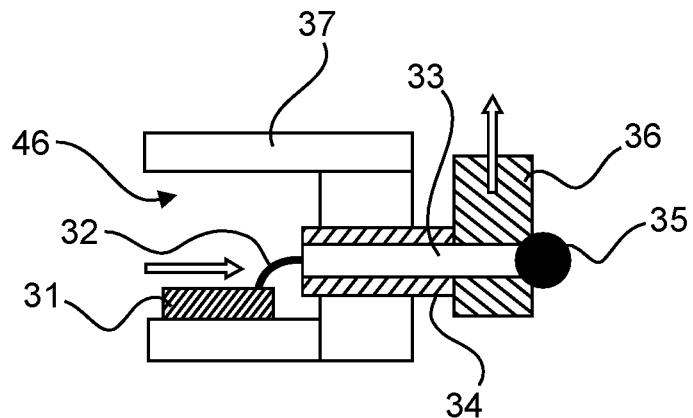
FIG. 3 a schematic drawing of a coaxial coupling of an amplifier to a waveguide.
Figure 4:
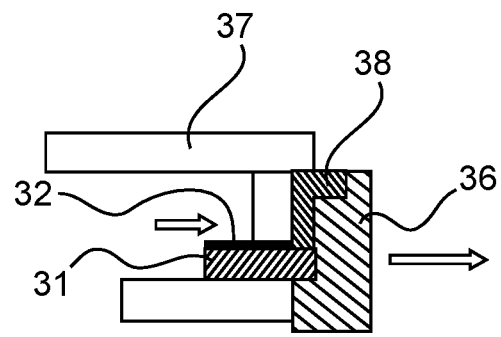
FIG. 4 a schematic drawing of a force-fitting coupling between an amplifier and a waveguide.
Figure 5:
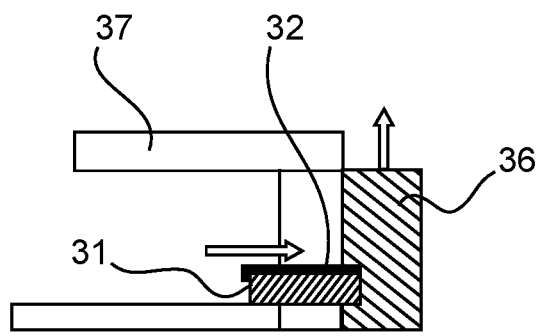
FIG. 5 a schematic drawing of a force-fitting and positive coupling between an amplifier and a waveguide.

For a better understanding of the disclosure, FIGS. 3 to 5 show existing connector interfaces of a waveguide to an amplifier element.

FIG. 3 shows a connector variant using a coaxial cable, which forms an inductive transition to the waveguide. An internal electrical conductor 33 of the coaxial cable is connected to the waveguide 36 by means of a fixing element 35, such as a screw connection. The coaxial cable is fed through the housing 37. The internal electrical conductor 33 in this case is fitted with an insulating sheath 34. The insulating sheath 34 surrounds the conductor 33 and can include, for example, of polytetrafluoroethylene or other insulating material. Within the housing 37, in the interior 46 thereof, the conductor 33 is connected to an electronic substrate 31. This connection 32 can be produced, for example, in stripline technology by means of a microstrip. The substrate 31 can be the high-power amplifier 26 shown in FIG. 2.

The signal path of the signal to be amplified is indicated by two arrows. A signal is fed to the high-power amplifier 31, where it is processed (i.e. amplified) and fed via the connection 32 and the coaxial cable 33, 34 to the waveguide 36.

The structure in FIG. 3 has the following properties, which under certain circumstances and depending on the application area, may be undesirable: because the coaxial conductor 33 is mechanically connected to the waveguide 36, a high mechanical stress can be exerted on the connection 32, for example in the event of temperature fluctuations and the resulting thermal expansion of the waveguide and the housing, as well as other components. In order to prevent this stress, the housing can be made of a rigid material, but this would detrimentally increase the weight. The coaxial cable also has a large influence on the losses. Finally, this design is characterized by an unfavorable assembly sequence, because the waveguide is connected to the coaxial cable before the coaxial cable is connected to the substrate 31 via a stripline 32. This complicates the access to the substrate 31 and to the bonding sites.

FIG. 4 shows an alternative connection technique in which the waveguide 36 has metallic ribs 38. The metallic ribs are in direct galvanic connection with a microstrip connection 32.

In this structure, the metallic rib 38 exerts a compressive force on the microstrip line to produce the galvanic connection. This pressure affects the quality of the galvanic connection. In the event of temperature fluctuations, however, the compressive force can vary due to the different materials of the rib 38 and the substrate 31 as well as the microstrip line 32. The materials have different thermal expansion coefficients, which results in mechanical stress on the connection points when the temperature fluctuates. The waveguide 36 in this structure is also not thermo-mechanically decoupled from the substrate 31. In addition, a substrate with a printed microstrip line 32 is required, which also introduces losses.

FIG. 5 shows a further option for a connection between the waveguide 36 and an electronic component 31. The substrate 31 has a metallization 32 and is coupled directly into the waveguide 36 outside the housing 37. To achieve this, part of the substrate 31 protrudes out of the housing 37.

In this structure, however, the substrate 31 protrudes into the waveguide 36 without mechanical support and can be exposed to significant mechanical stress.

Figure 6:
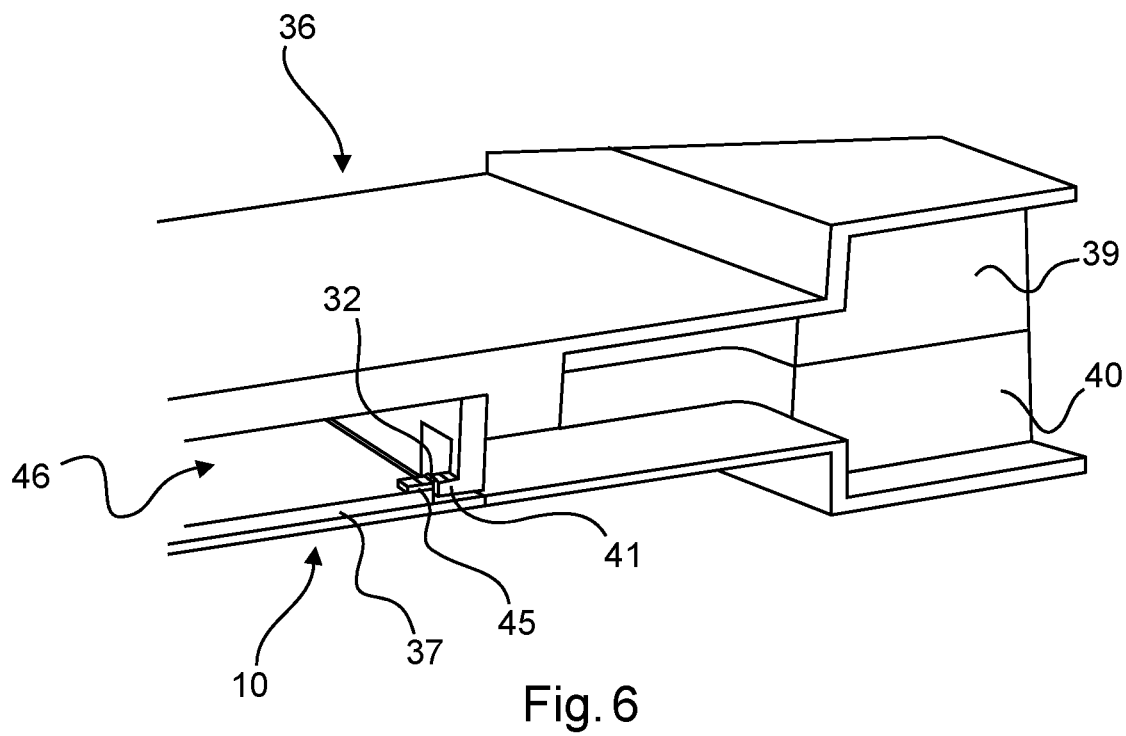
FIG. 6 a schematic isometric drawing of a high-frequency module in accordance with one exemplary embodiment.

In contrast to this, FIG. 6 shows a structure in which the electronic unit 45 (corresponding to the substrate 31) is connected to the housing 37 via a microstrip connection 32. The electronic unit 45 is arranged in the interior 46 of the housing 37. For example, the electronic unit 45 is arranged on a base surface of the housing and is mechanically connected to the base surface, or fixed thereto. It is possible for the electronic unit to also be mounted at a different position in the interior of the housing.

The internal connector 41 is part of the housing. In the example of FIG. 6 the internal connector 41 is designed as a tab. The tab is designed integrally with the housing, for example with a side wall of the housing. In FIG. 6, the tab protrudes in the direction of the interior space 46 at a right angle with respect to the side wall. The connection 32 connects the electronic unit 45 to a surface of the tab. The tab can be arranged and designed in such a way that one surface of the tab is located at the same height as a surface of the electronic unit. In the example of FIG. 6 the upper face of the tab is at the same height as the upper face of the electronic unit. The connection 32 is therefore arranged such that its two ends are located at the same height.

The housing 37 is surrounded by a waveguide structure 36. The waveguide structure 36 in this example includes two half-shells 39, 40. The half-shells are joined together such that the housing 37 is at least partially or even completely surrounded by the half-shells. Thus, the signal from the electronic unit 45 is routed to the waveguide 36 via the internal connector 41 and the housing 37. At least one half-shell of the waveguide rests at least partially against the outside wall of the housing 37 so that a galvanic connection is produced and the signal can be coupled into the waveguide.

This structure makes it possible to mechanically decouple the electrical connection 32 from the waveguide 36. The junction with the waveguide is provided by ribs or webs (such as the tab of the internal connector) in the housing. The ribs or webs can be milled into the housing or a housing wall. Such a web forms a mounting boss in the housing. The mounting boss projects from the housing wall in the direction of the electronic unit. This reduces a distance to the electronic unit, which can simplify the production of the connection 32.

The waveguide 36 can be bolted to the housing. The waveguide can be arranged on the housing such that its extension direction corresponds to the propagation direction of the signal path. Changes to the extension direction of the waveguide can be implemented using bends or rotations.

The structure shown in FIG. 6 reduces HF signal losses because the waveguide structure is coupled directly to the output of the electronic unit via the housing. The sensitive connection 32 is mechanically decoupled from the waveguide. This makes it possible that only the housing with the electronic unit arranged therein is produced and connected first, before the waveguide is attached.

Figure 7:
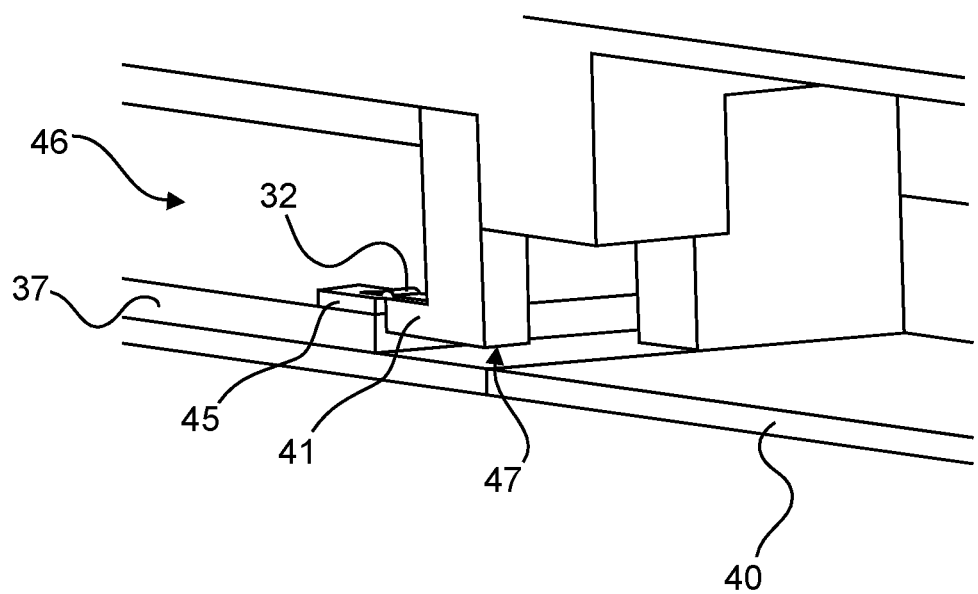
FIG. 7 a schematic isometric drawing of a high-frequency module in accordance with another exemplary embodiment.

FIG. 7 shows another example of a high-frequency module. The housing 37 in this example is also manufactured from two half-shells and the internal connector 41, designed as a tab or web, is part of a half-shell of the housing. Preferably, the internal connector 41 is designed as part of the half-shell, on which the electronic unit is also mounted.

On the output side of the housing to the waveguide, a stepped waveguide connection or a ribbed structure can be provided. This structure has the function of converting the electrical signal at the internal connector from the stripline mode to the waveguide mode and, if appropriate, to rotate the waveguide axis into a desired direction.

Figure 8:
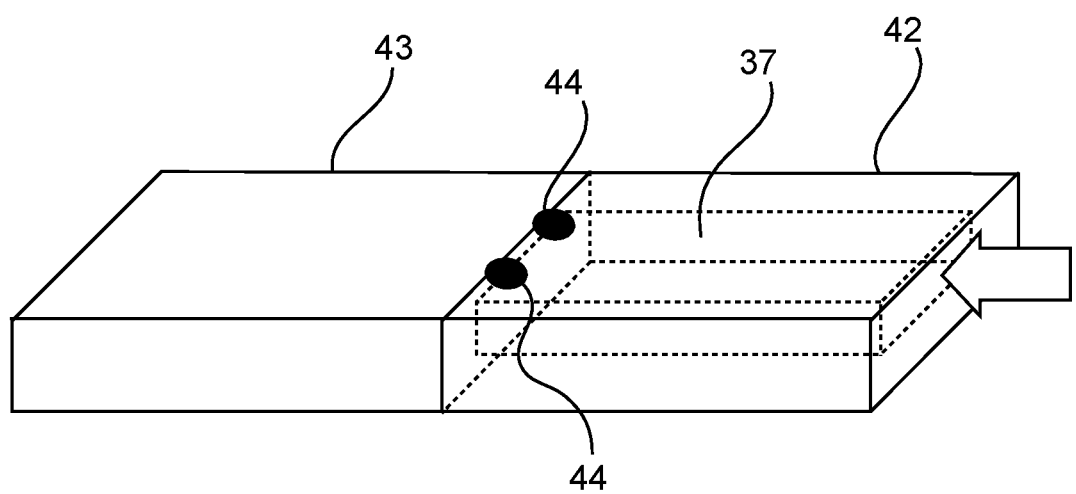
FIG. 8 a schematic isometric drawing of a high-frequency module in accordance with another exemplary embodiment.

FIG. 8 shows the housing 37 within a waveguide structure having the two waveguide sections 42, 43. The housing 37 is arranged within a first waveguide section 42. This waveguide section 42 can include two half-shells, as described in connection with FIG. 6. The housing can be bolted in this position inside the first waveguide section 42.

The first waveguide section 42 is positioned on the second waveguide section 43 in the direction of the arrow and also coupled thereto. The housing 37 is thus located entirely within the waveguide structure. External connectors 44 provide a schematic indication of the signal transition from the housing 37 to the waveguide structure.

It is also noted for completeness that "comprising" or "having" does not exclude any other elements or steps, and "a" or "an" does not exclude a plurality. It should also be noted that features or steps which have been described with reference to any one of the above examples can also be used in combination with other features or steps of other exemplary embodiments described above. Reference numerals in the claims are not to be regarded as restrictive.

| | List of reference numerals |
|---|---|
| 1 | satellite |
| 2 | transmission unit, antenna |
| 10 | high-frequency module |
| 20 | block circuit diagram of an amplifier module |
| 22 | input interface |
| 24 | pre-amplifier |
| 26 | high-power amplifier |
| 28 | output interface |
| 31 | electronic substrate |
| 32 | connection |
| 33 | electrical conductor |
| 34 | sheath, dielectric |
| 35 | fixing element |
| 36 | waveguide |
| 37 | housing |
| 38 | connecting rib |
| 39 | first half-shell |
| 40 | second half-shell |
| 41 | internal connector |

-continued

| | List of reference numerals |
|---|---|
| 42 | first waveguide section |
| 43 | second waveguide section |
| 44 | external connector |
| 45 | electronic unit |
| 46 | interior space |
| 47 | gap |

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A high-frequency module, comprising:
   an electronic unit;
   a housing, which at least partially encloses the electronic unit, and the electronic unit is arranged at least partially in an interior space of the housing;
   an internal connector, which is arranged on the housing and coupled to the electronic unit such that electrical signals can be transmitted between the electronic unit and the internal connector;
   the internal connector being constructed integrally with at least a part of the housing;
   a first waveguide section, which rests against an outer surface of the housing;
   the first waveguide section comprising a first half-shell and a second half-shell; and
   the housing being arranged between the first half-shell and the second half-shell.

2. The high-frequency module according to claim 1, the internal connector being formed by an internal surface of the housing.

3. The high-frequency module according to claim 1, the internal connector being formed by a tab of the housing that projects into the internal space.

4. The high-frequency module according to claim 3, wherein an electrically non-conductive material is at least partially arranged in a gap between the tab and adjacent housing wall sections.

5. The high-frequency module according to claim 1, the housing comprising aluminum or an aluminum alloy.

6. The high-frequency module according to claim 1, the electronic unit comprising a high-power amplifier.

7. The high-frequency module according to claim 1, wherein a connection between the electronic unit and the internal connector is a micro-strip connection.

8. The high-frequency module according to claim 1,
   the housing having a second internal connector, which is integral to the housing; and
   the second internal connector being connected to the electronic unit.

9. The high-frequency module according to claim 1, a surface of the housing being at least partially coated with gold or silver.

10. The high-frequency module according to claim 1, further comprising a second waveguide section, which is joined to the first waveguide section such that the housing is enclosed by the first waveguide section and the second waveguide section.

11. The high-frequency module according to claim 10, wherein the second waveguide section contains at least one element from the group comprising the following elements: filters, insulators, bends, antennas, circulators, multiplexers.

12. The high-frequency module according to claim 1, the housing being constructed integrally.

13. A communications satellite, comprising:
a data transmission link; and
a high-frequency module arranged in the data transmission link, wherein the high-frequency module comprises:
an electronic unit;
a housing, which at least partially encloses the electronic unit, and the electronic unit is arranged at least partially in an interior space of the housing;
an internal connector, which is arranged on the housing and coupled to the electronic unit such that electrical signals can be transmitted between the electronic unit and the internal connector;
the internal connector being constructed integrally with at least a part of the housing;
a first waveguide section, which rests against an outer surface of the housing;
the first waveguide section comprising a first half-shell and a second half-shell; and
the housing being arranged between the first half-shell and the second half-shell.

14. A high-frequency module, comprising:
an electronic unit;
a housing, which at least partially encloses the electronic unit, and the electronic unit is arranged at least partially in an interior space of the housing;
an internal connector, which is arranged on the housing and coupled to the electronic unit such that electrical signals can be transmitted between the electronic unit and the internal connector;
the internal connector being constructed integrally with at least a part of the housing; and
the internal connector being formed by a tab of the housing that projects into the internal space;
wherein an electrically non-conductive material is at least partially arranged in a gap between the tab and adjacent housing wall sections.

* * * * *